(12) United States Patent
Huang

(10) Patent No.: US 9,587,891 B2
(45) Date of Patent: Mar. 7, 2017

(54) HEAT SINK AND MOUNTING BRACKET ARRANGEMENT

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 215 days.

(21) Appl. No.: 14/590,675

(22) Filed: Jan. 6, 2015

(65) Prior Publication Data

US 2016/0131442 A1 May 12, 2016

(30) Foreign Application Priority Data

Nov. 11, 2014 (CN) .......................... 2014 1 0629304

(51) Int. Cl.
| | |
|---|---|
| *H05K 7/20* | (2006.01) |
| *F28F 3/02* | (2006.01) |
| *F28F 9/007* | (2006.01) |
| *F28D 15/02* | (2006.01) |
| *F28F 1/32* | (2006.01) |
| *H01L 23/40* | (2006.01) |
| *H01L 23/367* | (2006.01) |
| *H01L 23/427* | (2006.01) |

(52) U.S. Cl.
CPC ............. *F28F 3/02* (2013.01); *F28D 15/0233* (2013.01); *F28D 15/0275* (2013.01); *F28F 1/32* (2013.01); *F28F 9/007* (2013.01); *H01L 23/4006* (2013.01); *H01L 23/3672* (2013.01); *H01L 23/4093* (2013.01); *H01L 23/427* (2013.01); *H01L 2924/0002* (2013.01)

(58) Field of Classification Search
CPC . H01L 23/4093; H01L 23/4006; F28F 9/0075
See application file for complete search history.

(56) References Cited

U.S. PATENT DOCUMENTS

| | | | | |
|---|---|---|---|---|
| 5,509,465 A * | 4/1996 | Lai | ...................... | H01L 23/4093 257/718 |
| 5,621,244 A * | 4/1997 | Lin | ..................... | H01L 23/4093 257/718 |
| 5,784,254 A * | 7/1998 | Stephan | .............. | H01L 23/4093 165/185 |
| 5,834,842 A * | 11/1998 | Majumdar | .......... | H01L 23/4093 257/718 |
| 6,246,584 B1 * | 6/2001 | Lee | ..................... | H01L 23/4093 24/458 |

(Continued)

Primary Examiner — Leonard R Leo
(74) Attorney, Agent, or Firm — Pai Patent & Trademark Law Firm; Chao-Chang David Pai

(57) ABSTRACT

A heat sink and mounting bracket arrangement includes a radiation fin module including a stack of radiation fins and an insertion hole located in one end of the stack of radiation fins, and a mounting bracket made from a metal plate sheet by stamping and including a bottom panel clamped on a bottom wall of the stack of radiation fins, an angled mounting panel rearwardly extending from one end of the bottom panel, a mounting slot cut through opposing top and bottom surfaces of the mounting panel for the mounting of a fastening member to affix the mounting bracket to an external substrate, and an angled plug plate forwardly extending from the bottom panel and tightly press-fitted into the insertion hole of the radiation fin module.

6 Claims, 9 Drawing Sheets

(56) References Cited

U.S. PATENT DOCUMENTS

| | | | |
|---|---|---|---|
| 6,362,961 B1* | 3/2002 | Chiou | H01L 23/4093 |
| | | | 248/510 |
| 6,470,962 B1* | 10/2002 | Pao | H01L 23/4093 |
| | | | 165/185 |
| 6,621,704 B1* | 9/2003 | Liu | H01L 23/4093 |
| | | | 24/458 |
| 6,717,813 B1* | 4/2004 | Garner | H01L 23/4093 |
| | | | 257/E23.086 |
| 7,128,131 B2* | 10/2006 | Kubo | H01L 23/3672 |
| | | | 165/185 |
| 9,169,859 B2* | 10/2015 | Lin | H01L 23/427 |
| 2003/0159819 A1* | 8/2003 | Lee | H01L 23/4006 |
| | | | 165/185 |
| 2005/0111196 A1* | 5/2005 | Wang | H01L 23/4093 |
| | | | 257/718 |
| 2005/0152119 A1* | 7/2005 | Lee | H01L 23/4093 |
| | | | 361/710 |

* cited by examiner

HEAT SINK AND MOUNTING BRACKET ARRANGEMENT

BACKGROUND OF THE INVENTION (a) Field of the Invention

The present invention relates to heat sink technology, and more particularly to a heat sink and mounting bracket arrangement, which comprises a radiation fin module, and a mounting bracket press-fitted into the radiation fin module and clamped on the bottom wall of the radiation fin module for enabling the radiation fin module to be conveniently fastened to a substrate.

(b) Description of the Prior Art

Conventional heat sinks generally comprise a heat sink base and a radiation fin module. Some heat sinks have heat pipes added thereto, and a heat transfer plate bonded to the heat pipes outside the radiation fin module and the heat sink base. In this design, each heat pipe has the hot end thereof directly or indirectly attached to the heat source, and the cold end thereof embedded to the heat sink base or inserted through the radiation fin module. Thus, the heat pipes can rapidly transfer waste heat from the heat source to the radiation fins of the radiation fin module for quick dissipation into the outside open air. The radiation fin module comprises a plurality of radiation fins arranged in parallel. When fastening the heat sink to a substrate (PC board), an auxiliary fastener is normally used to affix the heat sink to the substrate, keeping the heat sink base in tight contact with the heat source. An auxiliary fastener for this purpose is specifically configured according to the configuration of the heat sink to be used.

Taiwan Patent M298873 discloses an auxiliary fastener entitled "Hold-Down Fixture for Heat Sink". The hold-down fixture comprises a base frame and a holding down member. The heat sink has hooks for the mounting of the base frame. The holding down member is inserted into the base frame and engaged into a substrate to secure the heat sink to the substrate.

In the aforesaid prior art heat sink comprising a heat sink base, a radiation fin module, heat pipes and a heat transfer plate, each heat pipe has its one end bonded to the heat transfer plate, and the heat transfer plate has mounting lugs for fastening to a substrate. Further, the heat pipes are embedded or inserted through the radiation fin module. Further, the rear end of the radiation fin module is directly soldered to the substrate, or bonded to the substrate with an adhesive. However, it is complicated to bond the radiation fin module to the substrate using a soldering technique or an adhesive.

SUMMARY OF THE INVENTION

The present invention has been accomplished under the circumstances in view. It is the main object of the present invention to provide a heat sink and mounting bracket arrangement, which comprises a radiation fin module and a mounting bracket. The radiation fin module comprises a stack of radiation fins, and an insertion hole located in one end of the stack of radiation fins. The mounting bracket is made from a metal plate sheet by stamping, comprising a bottom panel clamped on a bottom wall of the stack of radiation fins, an angled mounting panel rearwardly extending from one end of the bottom panel, a mounting slot cut through opposing top and bottom surfaces of the mounting panel for the mounting of a fastening member to affix the mounting bracket to an external substrate, and an angled plug plate forwardly extending from the bottom panel and tightly press-fitted into the insertion hole of the radiation fin module. Thus, the heat sink and mounting bracket arrangement can be conveniently assembled and quickly fastened to a substrate.

Preferably, the mounting bracket further comprises a row of ribs located at a bottom surface of the angled plug plate and spaced from one another corresponding to the gaps in between the radiation fins. Thus, after the angled plug plate is press-fitted into the insertion hole of the radiation fin module, the ribs are respectively engaged into the gaps in between the radiation fins, enhancing the connection tightness between the mounting bracket and the radiation fin module and effectively prohibiting separation between the angled plug plate of the mounting bracket and the insertion hole of the radiation fin module.

Preferably, the mounting bracket further comprises an opening located in the bottom panel corresponding to the angled plug plate, and a plurality of ribs located at the top surface of the bottom panel and disposed at two opposite lateral sides relative to the opening. After insertion of the angled plug plate into the insertion hole of the radiation fin module and clamping of the bottom panel on the bottom wall of the radiation fin modules, the ribs at the bottom panel are respectively engaged in gaps in between the radiation fins of the radiation fin module, enhancing the connection tightness between the mounting bracket and the radiation fin module.

Preferably, the heat sink and mounting bracket arrangement further comprises at least one heat pipe mounted in the radiation fin module, and a heat transfer plate connected with the at least one heat pipe outside the radiation fin module. Each heat pipe has a cold end thereof embedded in the stack of radiation fins of the radiation fin module, and an opposing hot end extending out of the radiation fin module and bonded to the heat transfer plate.

DETAILED DESCRIPTION OF THE PREFERRED EMBODIMENTS

Figure 1:
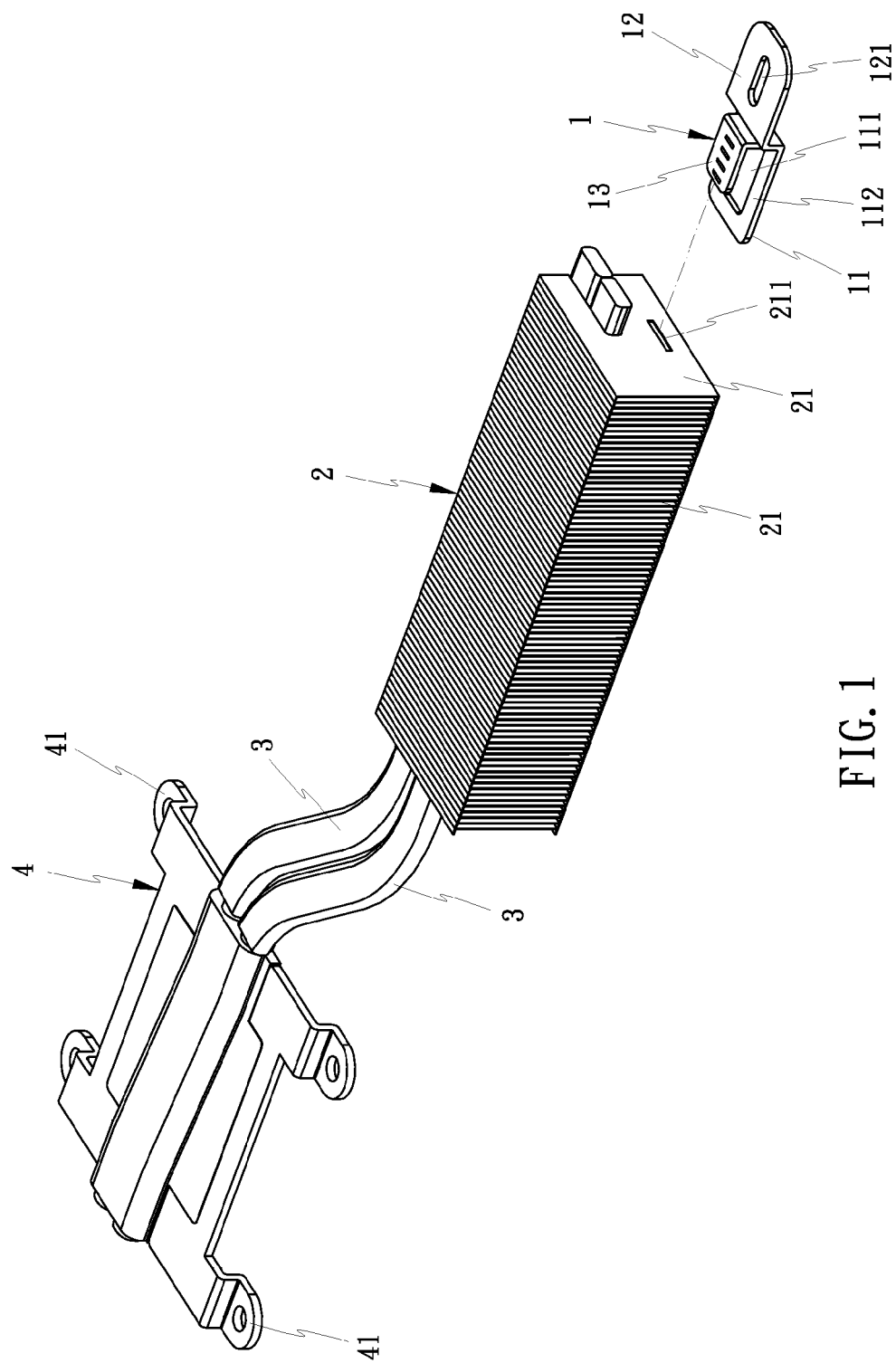
FIG. 1 is an exploded view of a heat sink and mounting bracket arrangement in accordance with a first embodiment of the present invention.
Figure 2:
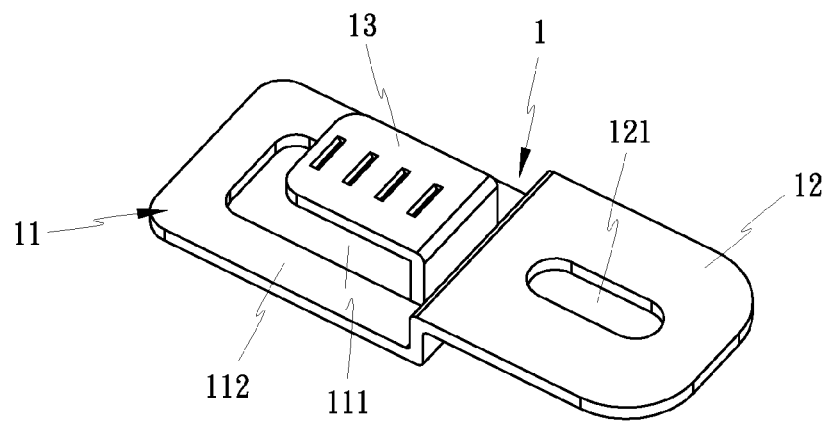
FIG. 2 is an oblique top view of a mounting bracket for the heat sink and mounting bracket arrangement in accordance with the first embodiment of the present invention.
Figure 3:
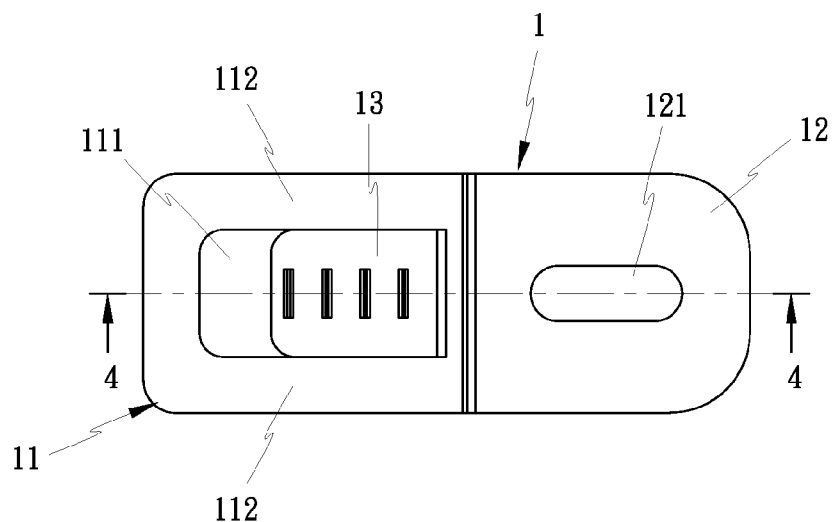
FIG. 3 is a top view of FIG. 2.
Figure 4:
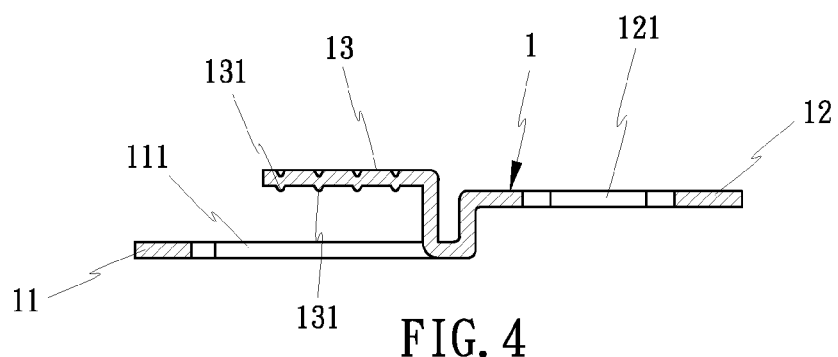
FIG. 4 is a sectional view taken along line 4-4 of FIG. 3.
Figure 5:
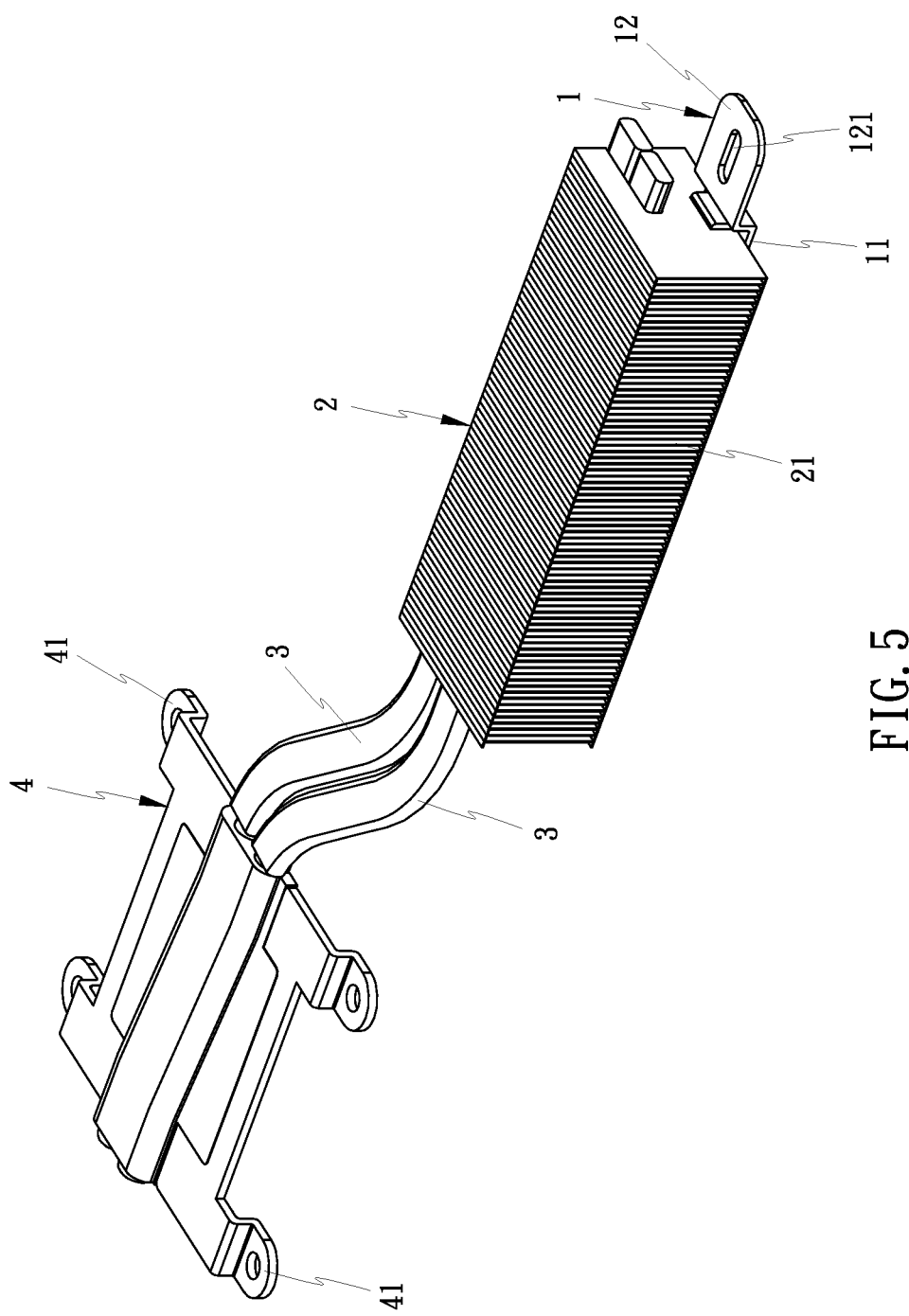
FIG. 5 is an oblique top view of the first embodiment of the present invention, illustrating heat pipes embedded in the radiation fin module and a heat transfer plate bonded to the heat pipes outside the radiation fin module.

Referring to FIGS. 1 and 2, a heat sink and mounting bracket arrangement in accordance with a first embodiment of the present invention is shown. The heat sink and mounting bracket arrangement comprises a radiation fin module 2, and a mounting bracket 1 connected to a rear end of the radiation fin module 2 in a tight fit manner. As illustrated in FIG. 3 and FIG. 4, the mounting bracket 1 is made from a metal plate sheet by stamping, comprising a bottom panel 11, an angled mounting panel 12 rearwardly extending from one end of the bottom panel 11, a mounting slot 121 cut through opposing top and bottom surfaces of the mounting panel 12, and an angled plug plate 13 forwardly extending from the bottom panel 11 adjacent to the angled mounting panel 12. Thus, the angled plug plate 13 extends in a direction opposite to the angled mounting panel 12. The radiation fin module 2 comprises a stack of radiation fins 21, and an insertion hole 211 located in one end of the stack of radiation fins 21. The angled plug plate 13 of the mounting bracket 1 is tightly press-fitted into the insertion hole 211, and thus the mounting bracket 1 and the radiation fin module 2 are tightly connected together (see FIG. 5).

The aforesaid mounting bracket 1 is tightly connected to the radiation fin module 2 by tightly press-fitting the angled plug plate 13 into the insertion hole 211. The mounting slot 121 of the mounting panel 12 of the mounting bracket 1 is adapted for the mounting of a fastening member (such as a screw bolt) to affix the tail end (the mounting bracket 1) of the radiation fin module 2 to a substrate (e.g. PC BOARD).

Figure 6:
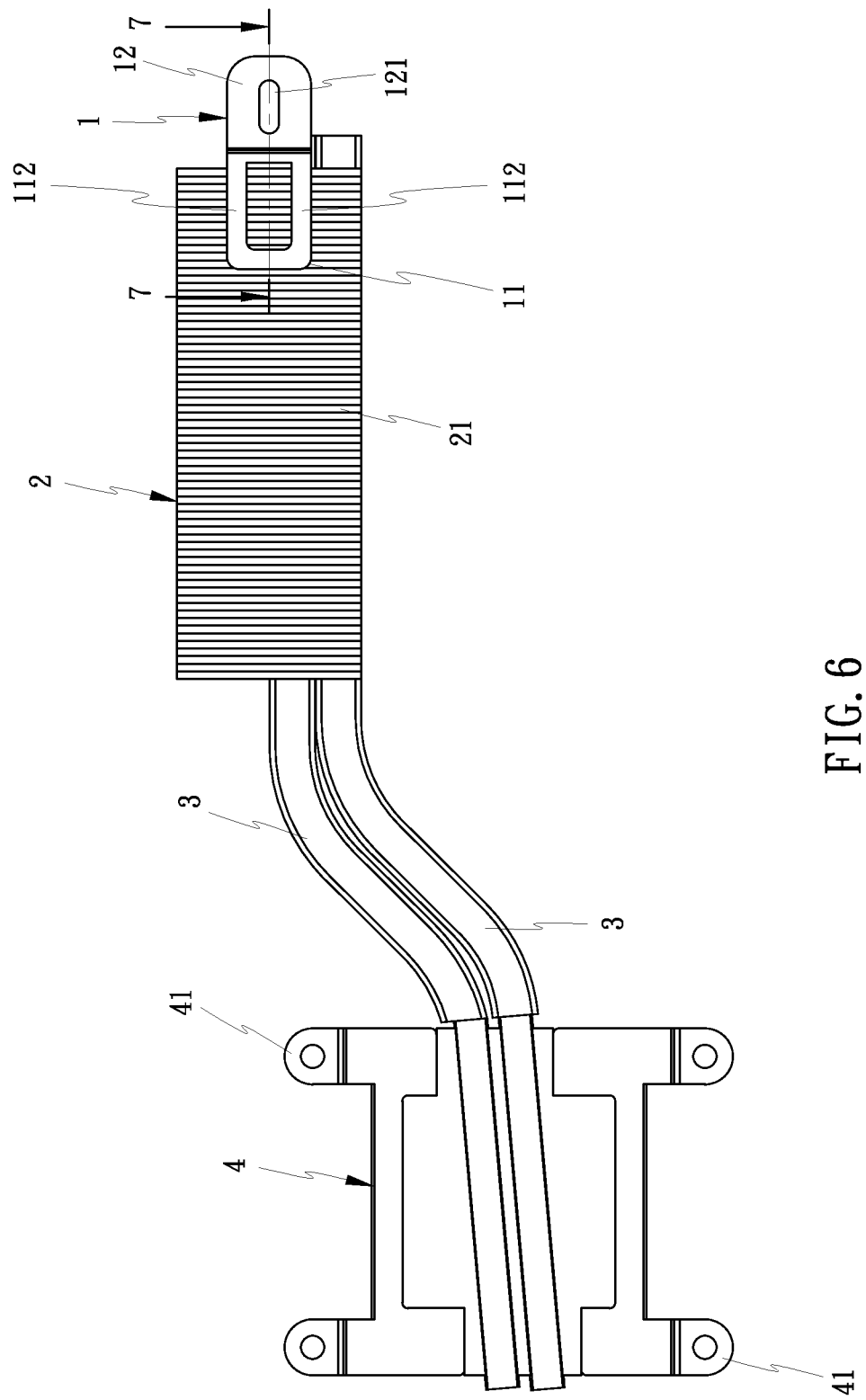
FIG. 6 is a bottom view of FIG. 5.

Referring to FIG. 6, the bottom panel 11 of the mounting bracket 1 is clamped on a bottom wall of the radiation fin module 2, and the angled plug plate 13 is tightly press-fitted into the insertion hole 211 of the radiation fin module 2, and thus the mounting bracket 1 and the radiation fin module 2 are tightly held down and clamped together.

Figure 7:
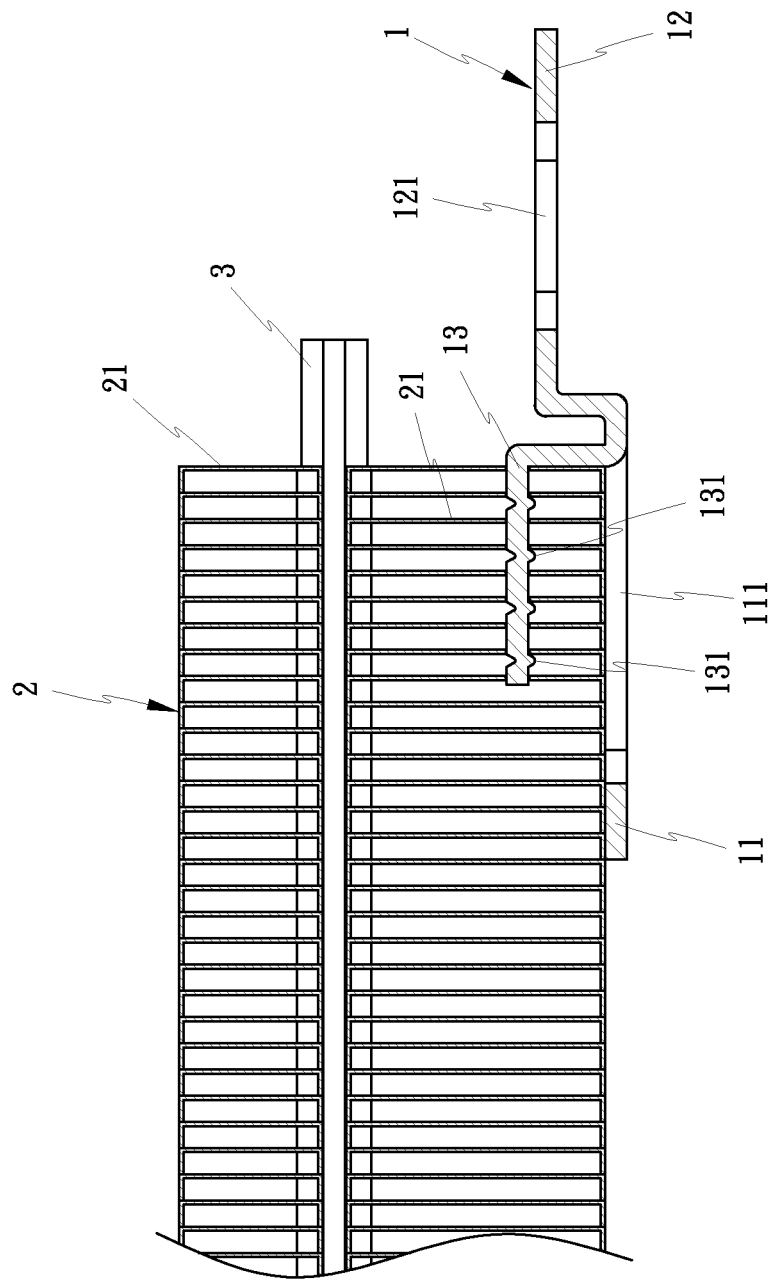
FIG. 7 is a sectional view taken along line 7-7 of FIG. 6.

Referring to FIG. 7, the angled plug plate 13 of the mounting bracket 1 comprises a row of ribs 131 located at an inner (bottom) surface thereof and spaced from one another corresponding to the gaps in between the radiation fins 21. Thus, after insertion of the angled plug plate 13 into the insertion hole 211, the ribs 131 are respectively engaged into the gaps in between the radiation fins 21, enhancing the connection tightness between the mounting bracket 1 and the radiation fin module 2 and effectively prohibiting separation between the angled plug plate 13 of the mounting bracket 1 and the insertion hole 211 of the radiation fin module 2.

Further, the angled plug plate 13 of the mounting bracket 1 is formed of a part of the metal plate sheet in the stamping process, leaving an opening 111 in the bottom panel 11.

Figures 8, 9:
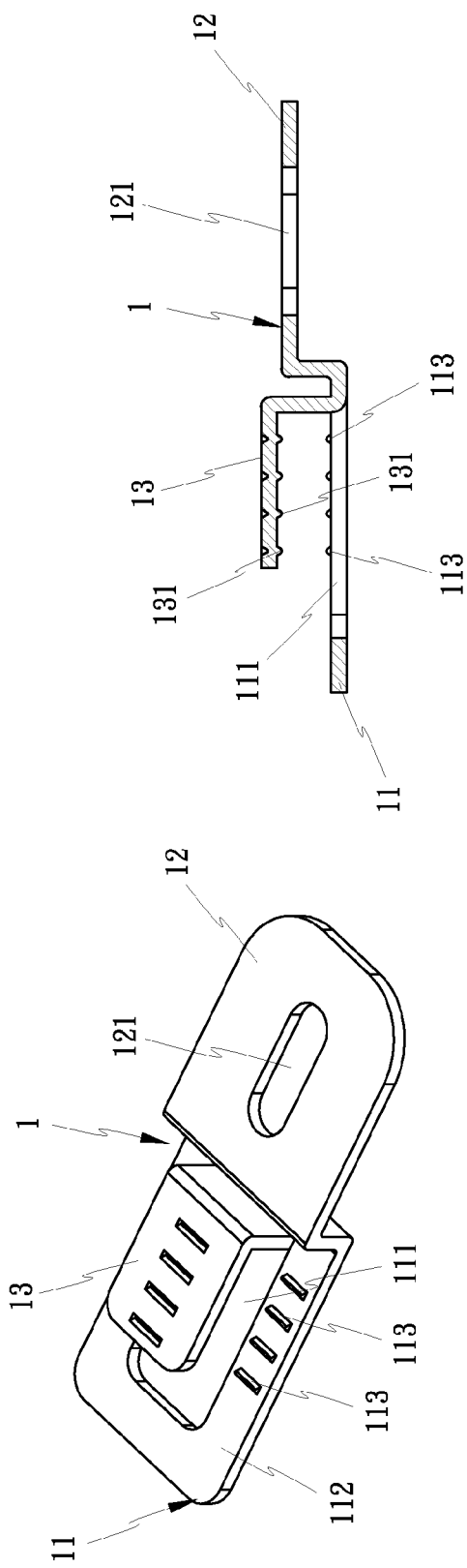
FIG. 8 is an oblique top view of a mounting bracket for the heat sink and mounting bracket arrangement in accordance with a second embodiment of the present invention.
FIG. 9 is a sectional view of the mounting bracket shown in FIG. 8.
Figure 10:
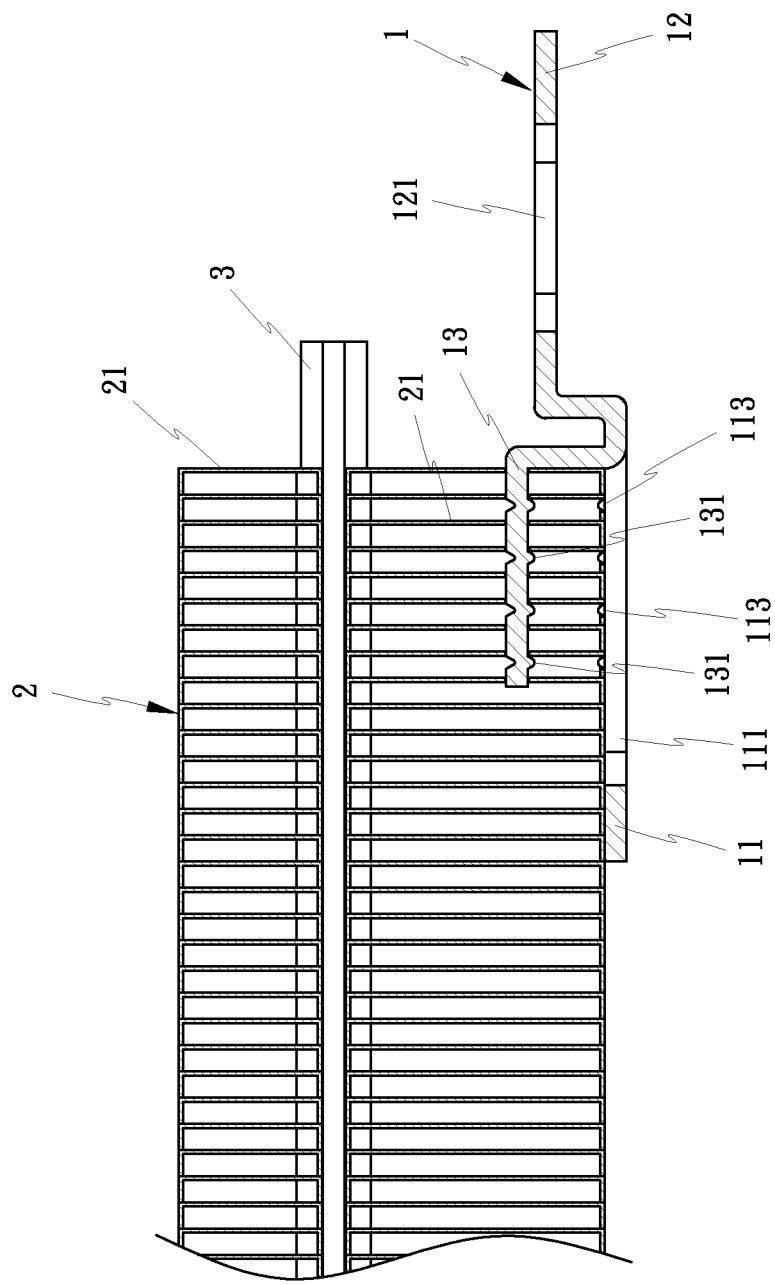
FIG. 10 is a sectional view of the heat sink and mounting bracket arrangement in accordance with the second embodiment of the present invention.

In a second embodiment of the present invention, as shown in FIG. 8 and FIG. 9, two rows of ribs 113 are located at the top surface 112 of the bottom panel 11 and symmetrically disposed at two opposite lateral sides relative to the opening 111. In each row, the ribs 113 are spaced from one another corresponding to the gaps in between the radiation fins 21. Thus, after insertion of the angled plug plate 13 into the insertion hole 211, the ribs 113 at the top surface 112 of the bottom panel 11 and the ribs 131 at the angled plug plate 13 are respectively engaged into the gaps in between the radiation fins 21, enhancing the connection tightness between the mounting bracket 1 and the radiation fin module 2 and effectively prohibiting separation between the mounting bracket 1 and the radiation fin module 2.

Figure 12:
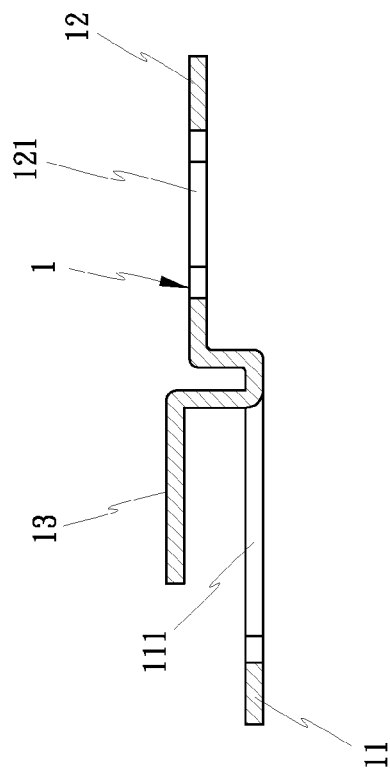
FIG. 12 is a sectional view of the mounting bracket shown in FIG. 11.
Figure 11:
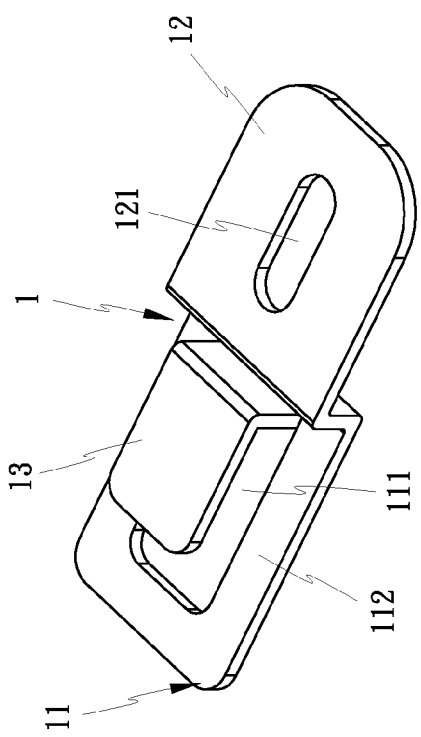
FIG. 11 is an oblique top view of a mounting bracket for the heat sink and mounting bracket arrangement in accordance with a third embodiment of the present invention.
Figure 13:
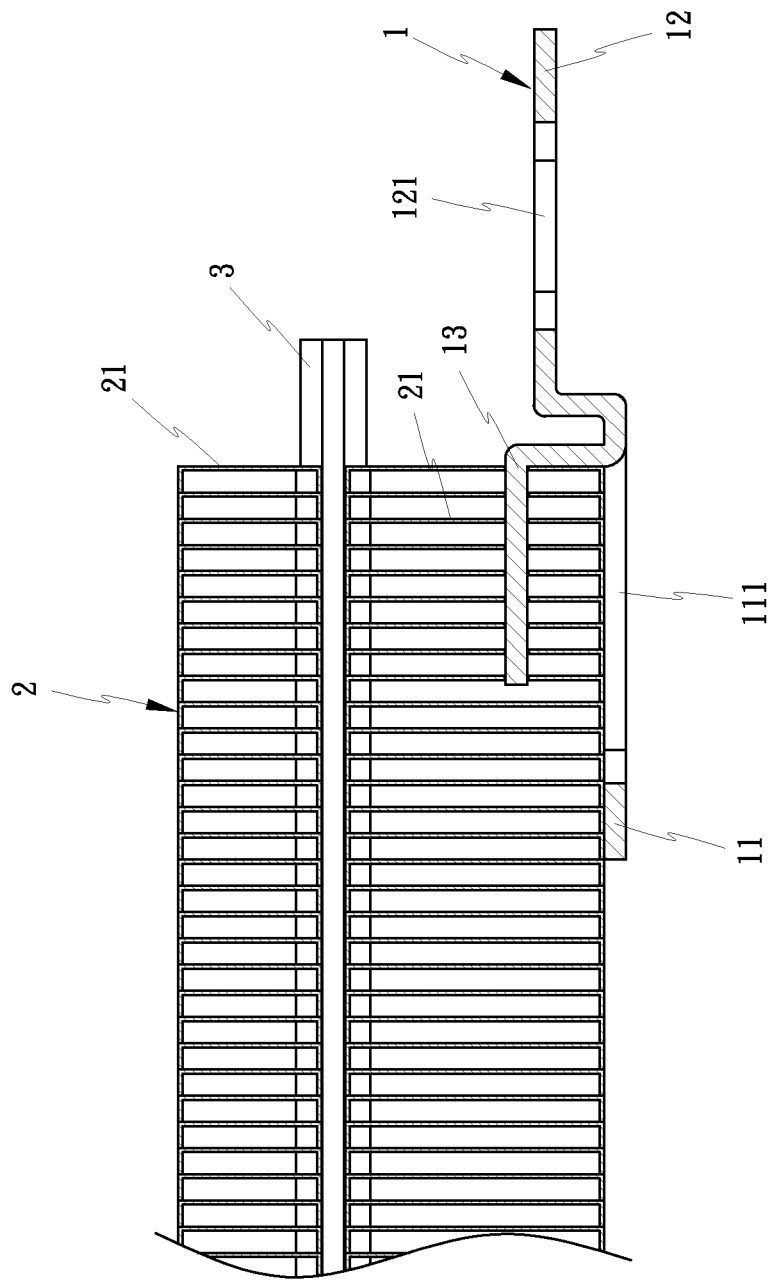
FIG. 13 is a sectional view of the heat sink and mounting bracket arrangement in accordance with the third embodiment of the present invention.

In a third embodiment of the present invention, as shown in FIGS. 11-13, the bottom panel 11 and angled plug plate 13 of the mounting bracket 1 do not have the aforesaid ribs 113,131, however, the thickness of the angled plug plate 13 is slightly larger than the size of the insertion hole 211 of the radiation fin module 2. After insertion of the angled plug plate 13 into the insertion hole 211 of the radiation fin module 2 by force, the mounting bracket 1 and the radiation fin module 2 are tightly secured together (see FIG. 1).

The annexed drawings simply illustrate the technical features of the aforesaid three embodiments of the present invention. It is to be understood that various modifications and enhancements may be made without departing from the spirit and scope of the invention.

In conclusion, the invention provides a heat sink and mounting bracket arrangement, which comprises a radiation fin module 2, and a mounting bracket 1 press-fitted into and clamped on a rear end of the radiation fin module 2. The heat sink and mounting bracket arrangement further comprises at least one heat pipe 3. Each heat pipe 3 has the cold end thereof embedded in the radiation fin module 2, and the hot end thereof extending out of the radiation fin module 2 and bonded to a heat transfer plate 4 that is adapted for fastening to a heat source and absorbing waste heat from it. The heat transfer plate 4 has a plurality of mounting lugs 41 for mounting. The invention enables the mounting bracket to be fastened to the radiation fin module by press-fitting and clamping instead of the welding or adhesive bonding techniques used in the prior art designs.

What is claimed is:

1. A heat sink and mounting bracket arrangement, comprising a radiation fin module, and a mounting bracket connected to a rear end of said radiation fin module, wherein said radiation fin module comprises a stack of radiation fins, and an insertion hole located in one end of said stack of radiation fins; said mounting bracket is made from a metal plate sheet by stamping, comprising a bottom panel clamped on said stack of radiation fins, an angled mounting panel rearwardly extending from one end of said bottom panel, a mounting slot cut through opposing top and bottom surfaces of said mounting panel for mounting a fastening member to affix said mounting bracket to an external substrate, and an angled plug plate forwardly extending from said bottom panel adjacent to said angled mounting panel and tightly press-fitted into said insertion hole of said radiation fin module.

2. The heat sink and mounting bracket arrangement as claimed in claim 1, wherein said bottom panel of said mounting bracket is clamped on a bottom wall of said radiation fin module.

3. The heat sink and mounting bracket arrangement as claimed in claim 1, wherein said mounting bracket further comprises a plurality of ribs located at a bottom surface of said angled plug plate and respectively engaged in gaps in between said radiation fins of said radiation fin module.

4. The heat sink and mounting bracket arrangement as claimed in claim 1, wherein said mounting bracket further comprises an opening located in said bottom panel corresponding to said angled plug plate, and a plurality of ribs located at a top surface of said bottom panel and disposed at two opposite lateral sides relative to said opening and respectively engaged in gaps in between said radiation fins of said radiation fin module.

5. The heat sink and mounting bracket arrangement as claimed in claim 1, wherein said angled plug plate of said mounting bracket has a thickness slightly larger than the size of said insertion hole of said radiation fin module.

6. The heat sink and mounting bracket arrangement as claimed in claim 1, further comprising at least one heat pipe mounted in said radiation fin module, and a heat transfer plate connected with said at least one heat pipe outside said radiation fin module, each said heat pipe having a cold end thereof embedded in said stack of radiation fins of said radiation fin module and an opposing hot end extending out of said radiation fin module and bonded to said heat transfer plate.

\* \* \* \* \*